(12) United States Patent
Hopper et al.

(10) Patent No.: US 8,704,454 B2
(45) Date of Patent: Apr. 22, 2014

(54) INTEGRATED DRIVER SYSTEM ARCHITECTURE FOR LIGHT EMITTING DIODES (LEDS)

(75) Inventors: Peter L. Hopper, San Jose, CA (US); Ann M. Gabrys, Santa Clara, CA (US); William French, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 534 days.

(21) Appl. No.: 12/925,078

(22) Filed: Oct. 13, 2010

(65) Prior Publication Data

US 2011/0084607 A1 Apr. 14, 2011

Related U.S. Application Data

(60) Provisional application No. 61/278,809, filed on Oct. 13, 2009.

(51) Int. Cl.
*H05B 37/00* (2006.01)
(52) U.S. Cl.
USPC ............... 315/227 R; 315/239; 315/229
(58) Field of Classification Search
USPC .......... 315/57, 70, 141–143, 177, 212, 220, 315/239, 246–282, 354, 173, 185 R–193, 315/223, 227 R–245, 229, 353, 355; 361/306.3, 328, 764, 603, 620, 623; 438/161, 193, 190, 210, 238–239, 250, 438/244, 253, 329, 387, 393, 396
See application file for complete search history.

(56) References Cited

U.S. PATENT DOCUMENTS

| | | | | |
|---|---|---|---|---|
| 5,610,425 A | * | 3/1997 | Quigley et al. | 257/358 |
| 6,011,683 A | | 1/2000 | Dat | |
| 6,977,807 B2 | * | 12/2005 | Arai et al. | 361/523 |
| 8,128,263 B2 | * | 3/2012 | Higuchi et al. | 362/373 |
| 2005/0162144 A1 | | 7/2005 | Kernahan | |
| 2006/0255753 A1 | | 11/2006 | Sawada et al. | |
| 2007/0216322 A1 | * | 9/2007 | Kim | 315/312 |
| 2008/0047743 A1 | * | 2/2008 | Komatsu et al. | 174/260 |
| 2009/0146575 A1 | | 6/2009 | Chu et al. | |

(Continued)

FOREIGN PATENT DOCUMENTS

EP 1 791 399 A1 5/2007

OTHER PUBLICATIONS

Notification of Transmittal of the International Search Report and the Written Opinion of the International Searching Authority, or the Declaration dated May 23, 2011 in connection with International Patent Application No. PCT/US2010/052456.

*Primary Examiner* — Douglas W Owens
*Assistant Examiner* — Henry Luong
(74) *Attorney, Agent, or Firm* — Andrew Viger; Wade J. Brady, III; Frederick J. Telecky, Jr.

(57) ABSTRACT

A method includes forming one or more capacitors over a substrate. The method also includes forming a transformer at least partially over the substrate. The transformer is adjacent to at least one of the one or more capacitors. At least a portion of the transformer is formed at a same level over the substrate as the one or more capacitors. The method further includes coupling the one or more capacitors and the transformer to at least one embedded integrated circuit die. The one or more capacitors, the transformer, and the at least one embedded integrated circuit die form at least part of a light emitting diode (LED) driver.

20 Claims, 3 Drawing Sheets

(56) References Cited

U.S. PATENT DOCUMENTS

2009/0230875 A1 9/2009 Sauerlaender et al.
2010/0013409 A1 1/2010 Quek et al.
2010/0230806 A1* 9/2010 Huang et al. .................. 257/723

* cited by examiner

INTEGRATED DRIVER SYSTEM ARCHITECTURE FOR LIGHT EMITTING DIODES (LEDS)

CROSS-REFERENCE TO RELATED APPLICATION AND PRIORITY CLAIM

This application claims priority under 35 U.S.C. §119(e) to U.S. Provisional Patent Application Ser. No. 61/278,809 filed on Oct. 13, 2009, which is hereby incorporated by reference.

TECHNICAL FIELD

This disclosure relates generally to lighting systems. More specifically, this disclosure relates to an integrated driver system architecture for light emitting diodes (LEDs).

BACKGROUND

Light emitting diodes (LEDs) are becoming more and more popular due to their low energy usage and their long operational lifespan. LEDs are typically controlled using LED drivers. There is interest in integrating LED drivers to minimize their form factor, provide improved system packing density, and reduce costs.

Integration, however, presents its own challenges. Integration generally involves reducing the overall form factor of an LED driver system by increasing the packing density of its components and optimizing the performance of the components to run at higher performance levels. This is done while taking a holistic view of the overall system's form factor when considering the underlying component matrix.

BRIEF DESCRIPTION OF DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

In accordance with this disclosure, an LED driver system is provided with tight three-dimensional integration of its components. This structure can be formed while avoiding packaging-related volume overhead. Various categories of components may be included in the integrated LED driver system, such as line voltage transistor devices, isolation transformers, high-frequency switching devices, rectification devices, smoothing devices (capacitances), control and intelligence devices, optical and thermal sensors, wireless or wired control interfaces (such as radio interfaces), and over-voltage suppression devices. Various ones of these components, such as integrated circuits, power diodes, and transistors, could be implemented in one or more discrete dies that are embedded into the integrated LED driver system.

Passive energy storage elements in this type of three-dimensional integration scheme may represent the largest components by volume of the integrated LED driver system. Thus, these components can take the lead in the set of considerations of overall system volume arrangement. The following describes one example of a process for forming an integrated LED driver system.

Figure 1:
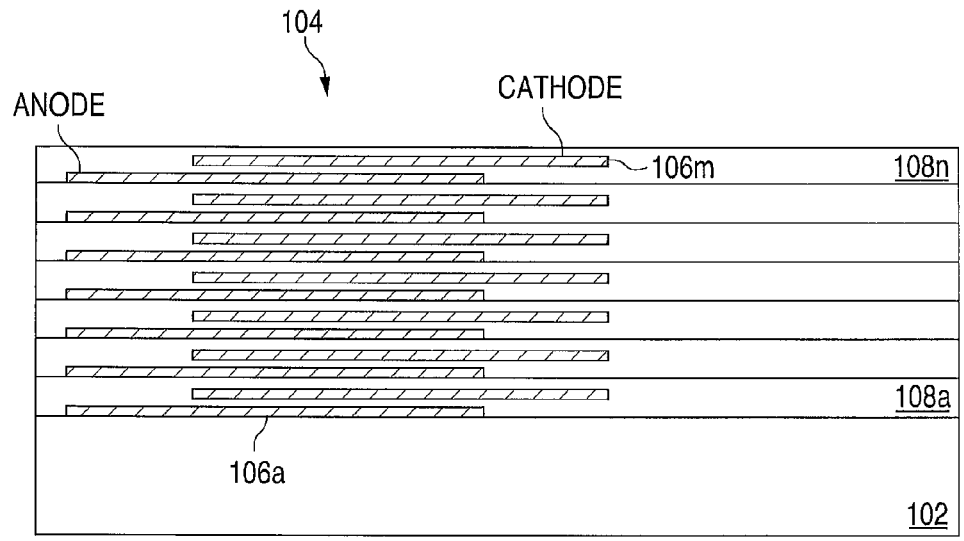
FIGS. 1 through 4 illustrate an example formation of capacitive structures and other structures in an integrated LED driver system according to this disclosure.

FIGS. 1 through 4 illustrate an example formation of capacitive structures and other structures in an integrated LED driver system according to this disclosure. As shown in FIG. 1, the process begins with a wafer level substrate 102, which is used to deliver mechanical strength during subsequent layer build-up processing steps. The wafer level substrate 102 could include a printed circuit board (PCB) with embedded metal or other conductive layers and with exposed vias at its surface, and vias can also be run through the substrate 102 as heat pipes. As particular examples, the wafer level substrate 102 may be formed from a silicon, copper, aluminum, or FR4 (glass reinforced epoxy laminate) resin board, optionally with interconnects already processed and in place in the substrate 102. Also, pre-formed metal or other conductive layers may be fabricated using a typical wafer process flow or a PCB processing flow.

A capacitor 104 is formed over the substrate 102. For example, a set of capacitors 104 can be formed on top of the wafer level substrate 102 using a multi-layer buildup process flow. In particular embodiments, the formation of the capacitors 104 could involve using a single wafer processing deposition tool with three or more chambers. Two chambers may respectively include shadow masking metal or other conductive masks representing an anode and a cathode of a capacitor 104. A third chamber can be used to deposit a dielectric layer, such as a dielectric layer formed by chemical vapor deposition (CVD) or plasma-enhanced chemical vapor deposition (PECVD) of $SiO_2$, SiON, or AlOx material. The wafer level substrate 102 can be processed though each chamber sequentially multiple times to form multiple conductive layers 106a-106m and multiple dielectric layers 108a-108n. In particular embodiments, there could be between five and one hundred layers of conductive and dielectric material. The conductive layers 106a-106m form interleaved layers of the capacitor's cathode and anode.

Figure 2:
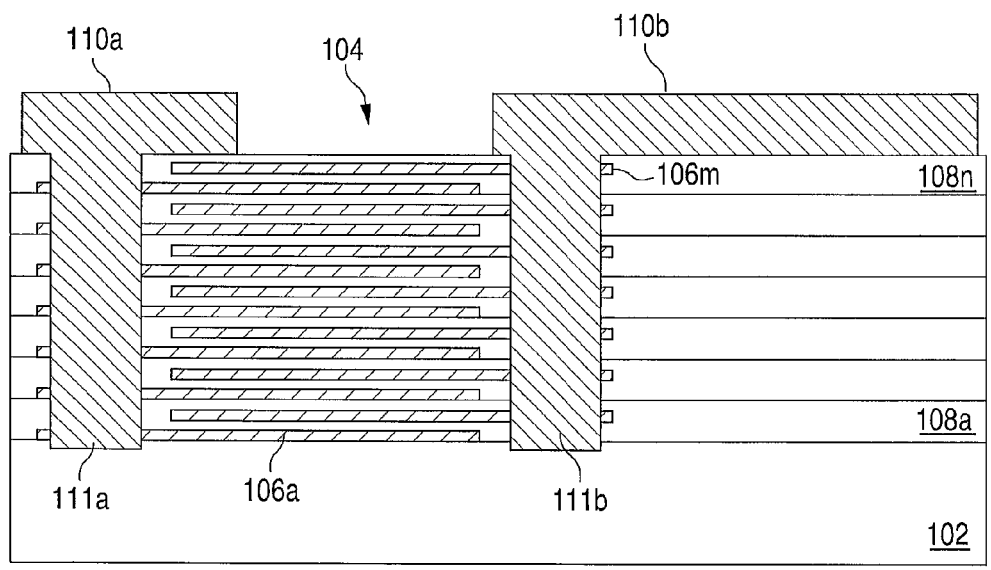

After formation of the stack of layers as shown in FIG. 1, the anodes and cathodes of the capacitor 104 are exposed to enable formation of electrical contacts 110a-110b as shown in FIG. 2. This could include, for example, performing a single lithographic and physical etch step to expose the cathodes and anodes to metalized or other electrical contacts suitable for use with a large-value capacitor. This etch could also open up vias 111a-111b to the metal or other conductive layers of the wafer level substrate 102 underlying the capacitor 104. This processing flow can result in a high density, high voltage capacitor with the minimal cost of a single contact mask and a single metal/conductive mask. The electrical contacts 110a-110b could be formed using any suitable material(s), such as a redistribution layer (RDL) of metal.

Figure 3:
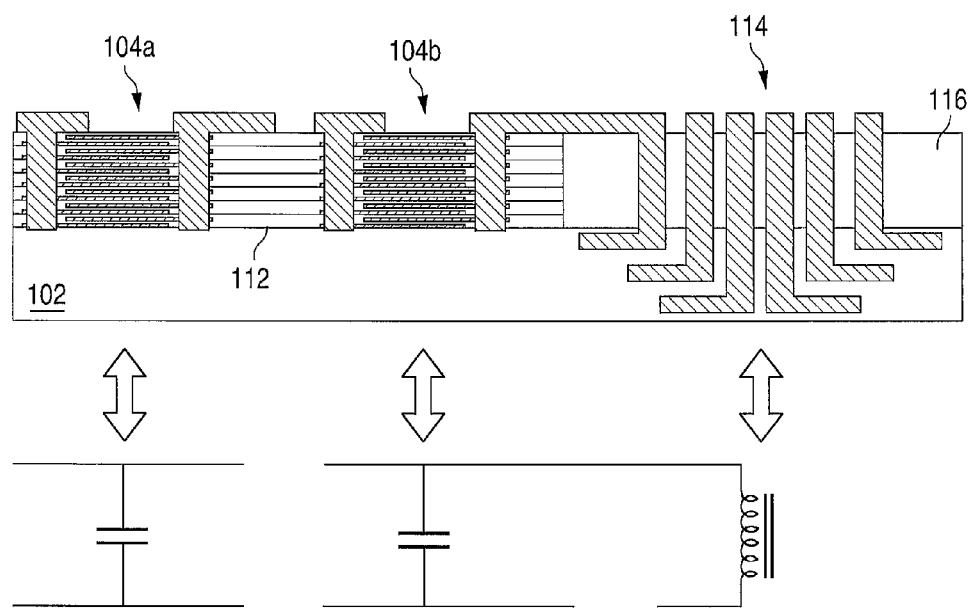
Figure 4:
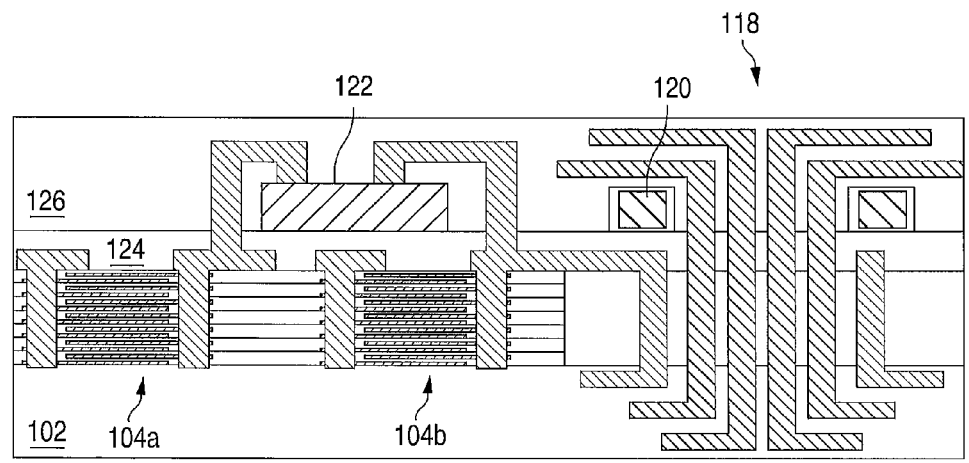

Another mask and metal/conductive layer could optionally be used as a redistribution layer definition plating electroplating mask. This could be done to provide the LED driver with de-coupled system power plane rails, each at various voltages throughout the system. In each isolated case, there could be a capacitor for smoothing and/or decoupling the voltage between the rails. Thus, several types of capacitors are envisioned and can be processed at the same time, where they are already isolated from one other by the deposited dielectric layers. FIG. 3 illustrates one example of this, where two capacitors 104a-104b are separated from one another by an inter-dielectric layer (IDL) 112 (formed by portions of the dielectric layers 108a-108n).

FIG. 3 also illustrates a bottom portion 114 of a transformer's windings, which are formed within a dielectric layer 116. The bottom portion 114 of the transformer is coupled to one of the capacitors 104b. FIG. 3 further illustrates the results obtained using both:

an etch mask used to define (i) vias that may be filled to link the electrodes of the capacitor terminals and (ii) vias used to contact the underlying substrate conductive interconnect; and an etch mask used to define (i) vias that contact the capacitors' "fins," (ii) redistribution conductive material connected to the capacitors, and (iii) conductive material to connect the underlying substrate interconnect.

In particular embodiments, the lower portion of the transformer windings can be formed within the substrate 102. After that, the capacitors 104a-104b can be formed. The dielectric layer 116 could be formed at the same time that the dielectric layers 108a-108n are formed, or the dielectric layer 116 could be formed separately. Vias through the dielectric layers 108a-108n and 116 can be formed, and the electrical contacts for the capacitors 104a-104b, the redistribution conductive material, and electrical contacts for the transformer windings can all be formed at the same time.

Inductive elements can also be fabricated, such as to provide a transformer core. Several transformer core processing options are available. For example, in low-current LED driver systems, a ferromagnetic core can be formed by electroplating. In mid-current LED driver systems, a ferromagnetic core can be formed by discrete core fabrication and wafer level embedding. Interconnects can be fabricated using epoxy build-up and plating metal/conductive material to close the turns around the transformer. These structures are depicted in more detail in FIG. 4, which shows a completed transformer 118 with an embedded ferromagnetic material core torroid 120. In addition, transistors, diodes, and other discrete devices can be selected and placed into the system as one or more embedded dies 122 within pre-formed cavities in one or more epoxy layers 124-126. These devices can be subsequently wired up with a final set of interconnect layers and contacts, bumps, or bonding areas formed on top.

Figure 5:
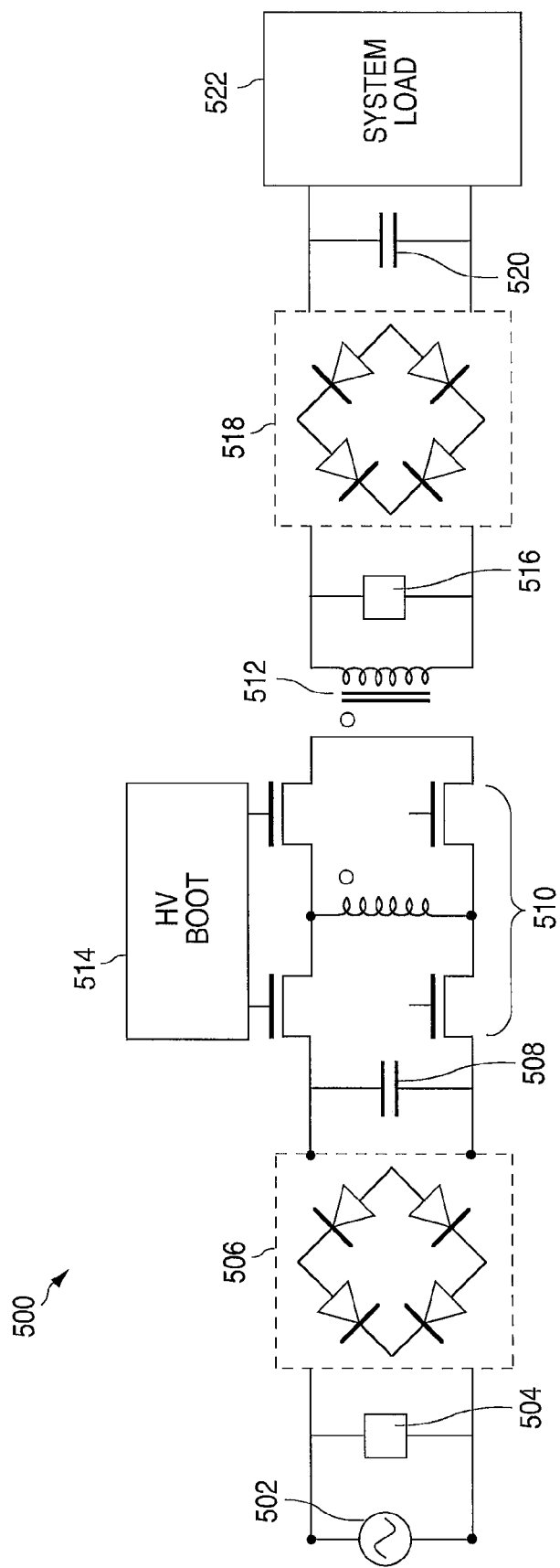
FIG. 5 illustrates an example power supply unit incorporating an integrated LED driver system according to this disclosure.

FIG. 5 illustrates an example power supply unit (PSU) 500 incorporating an integrated LED driver system according to this disclosure. As shown in FIG. 5, the PSU 500 includes or is coupled to an AC source 502, which provides a suitable AC voltage signal. A super-junction transient voltage suppressor 504 suppresses voltage transients in the AC voltage signal. A complementary bridge rectifier 506 performs rectification on the AC voltage signal. The bridge rectifier 506 in this example is formed by diodes, which could represent VHP700 power diodes. A micro-electro-mechanical (MEMS) capacitor 508 is coupled across the bridge rectifier 506. A complementary H-bridge 510 formed by transistors is coupled to the capacitor 508 and a transformer 512. A high voltage (HV) bootstrap circuit 514 controls the transistors in the H-bridge 510. An electro-static discharge (ESD) protection circuit 516 is coupled across the transformer 512 and a complementary bridge rectifier 518. The bridge rectifier 518 is again formed by diodes, such as PVIP25 or ABCD5 power diodes. A MEMS capacitor 520 is coupled across the bridge rectifier 518 and a system load 522, such as one or more light emitting diodes.

In the PSU 500 of FIG. 5, the capacitors 508 and 520 and the transformer 512 could be formed as shown in FIGS. 1-4. Also, the remaining components 504-506, 510, 514, 516-518 could be implemented using one or more embedded dies 122. In this way, the PSU 500 shown in FIG. 5 can implement the architecture shown in FIG. 4, allowing the architecture in FIG. 4 to drive one or more LEDs or some other system load 522.

Note that the description above has described the use of particular materials, such as silicon, copper, and epoxy. This is for illustration and explanation only. Each component shown in the figures could be formed in any suitable manner and from any suitable material(s).

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of forming an integrated power circuit with an integrated power supply, comprising:

forming a dielectric region having a first region and a second region over a substrate;

forming one or more capacitors in the first region of the dielectric region, each capacitor comprising:

multiple conductive layers separated by multiple dielectric layers horizontal to the substrate, the conductive layers comprising cathode layers interleaved with anode layers, the multiple dielectric layers comprising the first region of the dielectric region;

the interleaved cathode and anode layers offset to form cathode fins at a first end, and anode fins at a second end, the cathode and anode fins extending beyond the ends of respectively the anode layers and the cathode layers;

forming a plurality of lower transformer windings extending vertically in the second region of the dielectric region;

for each capacitor, forming first and second conductive vias, the first conductive via formed through the cathode fins, in contact with respective cathode layers and not in contact with any anode layer; and the second conductive via formed through the anode fins, in contact with respective anode layers and not in contact with any cathode layer;

forming a redistribution layer including contacts to each first and second conductive via, and contacts to the lower transformer windings;

forming a non-conductive layer over the one or more capacitors, and the lower transformer windings, and the redistribution layer;

disposing at least one embedded integrated circuit die in the non-conductive layer;

disposing a torroidal core in the non-conductive layer, over the lower transformer windings;

forming a plurality of upper transformer windings in the non-conductive layer, each upper transformer winding contacting a respective lower transformer winding, such that at least some of the upper transformer windings extend axially within the torroidal core;

the upper and lower transformer windings and the torroidal core comprising a transformer; and forming connections between the at least one integrated circuit die and the redistribution layer.

2. The method of claim 1, wherein the first and second conductive vias are formed such that respectively each cathode conductive fin surrounds the first conductive via, and each anode conductive fin surrounds the second conductive via.

3. The method of claim 1, wherein each of the at least one embedded integrated circuit die is disposed in the non-conductive layer by:

forming a cavity in the non-conductive layer; and placing in the cavity the integrated circuit die.

4. The method of claim 1, further comprising:

at least an input coupling capacitor and an output capacitor;

the redistribution layer including an interconnect between the first conductive via of the output capacitor and the lower transformer winding, such that a parallel connection is formed between the output capacitor and the lower transformer winding;

the at least one integrated circuit die including an input connected to the input coupling capacitor and an output connected to the output capacitor.

5. The method of claim 4, wherein the power circuit comprises an LED driver, and the at least one integrated circuit die comprises:

an input rectifier coupled to the input coupling capacitor, and an output rectifier coupled to the transformer; and multiple switching transistors coupled between the input rectifier and the transformer.

6. The method of claim 1, wherein forming the transformer comprises forming the lower transformer windings partially within the substrate.

7. The method of claim 6, wherein the torroidal core is disposed in the non-conductive layer by:

forming a cavity in the non-conductive layer; and placing in the cavity the torroidal core.

8. The method of claim 1, wherein the substrate is a printed circuit board.

9. An integrated power circuit including an integrated power supply comprising:

a substrate;

a dielectric layer, having a first region and a second region, disposed over the substrate, and a non-conductive layer disposed over the dielectric layer;

one or more capacitors disposed in the first region of the dielectric layer, each comprising;

multiple conductive layers separated by multiple dielectric layers horizontal to the substrate, the conductive layers comprising cathode layers interleaved with anode layers, the multiple dielectric layers comprising the first region of the dielectric layer;

the interleaved cathode and anode layers offset to form cathode fins at a first end, and anode fins at a second end, the cathode and anode fins extending beyond the ends of respectively the anode layers and the cathode layers; and a first conductive via formed through the cathode fins, in contact with respective cathode layers and not in contact with any anode layer; and a second conductive via formed through the anode fins, in contact with respective anode layers and not in contact with any cathode layer;

a transformer disposed at least partially in the second region of the dielectric layer and in the non-conductive layer, the transformer comprising a plurality of lower transformer windings disposed vertically in the second region of the dielectric layer; and a plurality of upper transformer windings disposed in the non-conductive layer, each upper transformer winding contacting a respective lower transformer winding;

a torroidal core disposed in the non-conductive layer, such that at least some of the upper transformer windings extend axially within the torroidal core;

a redistribution layer disposed within the non-conductive layer, including contacts to each first and second conductive via, and the lower transformer windings; and at least one embedded integrated circuit die disposed in the non-conductive layer, and coupled to the redistribution layer.

10. The circuit of claim 9, wherein the first and second conductive vias are formed such that respectively each cathode conductive fin surrounds the first conductive via, and each anode conductive fin surrounds the second conductive via.

11. The circuit of claim 9, wherein each of the at least one embedded integrated circuit die is disposed in a cavity in the non-conductive layer.

12. The circuit of claim 9, further comprising:

at least an input coupling capacitor and an output capacitor;

the redistribution layer including an interconnect between the first conductive via of the output capacitor and the lower transformer winding, such that a parallel connection is formed between the output capacitor and the lower transformer winding; and the at least one integrated circuit die including an input connected to the input coupling capacitor and an output connected to the output capacitor.

13. The circuit of claim 12, wherein the power circuit comprises an LED driver, and the at least one embedded integrated circuit die comprises:

an input rectifier coupled to the input coupling capacitor, and an output rectifier coupled to the transformer; and multiple switching transistors coupled between the input rectifier and the transformer.

14. The circuit of claim 9, wherein the lower transformer windings are disposed partially within the substrate.

15. The circuit of claim 9, wherein the torroidal core is disposed in a cavity in the non-conductive layer.

16. The circuit of claim 9, wherein the substrate is a printed circuit board.

17. A system for driving one or more light emitting diodes (LEDs) comprising:

one or more LEDs; and an LED driver configured to drive the one or more LEDs, the LED driver comprising:

a substrate;

a dielectric layer, having a first region and a second region, disposed over the substrate, and a non-conductive layer disposed over the dielectric layer;

one or more capacitors disposed in the first region of the dielectric layer, each comprising;
multiple conductive layers separated by multiple dielectric layers horizontal to the substrate, the conductive layers comprising cathode layers interleaved with anode layers, the multiple dielectric layers comprising the first region of the dielectric layer;
the interleaved cathode and anode layers offset to form cathode fins at a first end, and anode fins at a second end, the cathode and anode fins extending beyond the ends of respectively the anode layers and the cathode layers; and
a first conductive via formed through the cathode fins, in contact with respective cathode layers and not in contact with any anode layer; and a second conductive via formed through the anode fins, in contact with respective anode layers and not in contact with any cathode layer;
a transformer disposed at least partially in the second region of the dielectric layer and in the non-conductive layer, the transformer comprising
a plurality of lower transformer windings disposed vertically in the second region of the dielectric layer; and
a plurality of upper transformer windings disposed in the non-conductive layer, each upper transformer winding contacting a respective lower transformer winding;
a torroidal core disposed in the non-conductive layer, such that at least some of the upper transformer windings extend axially within the torroidal core;
a redistribution layer disposed within the non-conductive layer, including contacts to each first and second conductive via, and the lower transformer windings; and
at least one embedded integrated circuit die disposed in the non-conductive layer, and coupled to the redistribution layer.

18. The system of claim 17, wherein:
each of the at least one embedded integrated circuit die is disposed in a cavity in the non-conductive layer; and
the torroidal core is disposed in a cavity in the non-conductive layer.

19. The system of claim 17,
further comprising at least an input coupling capacitor and an output capacitor,
the redistribution layer including an interconnect between the first conductive via of the output capacitor and the lower transformer winding, such that a parallel connection is formed between the output capacitor and the lower transformer winding; and
the at least one integrated circuit die including an input connected to the input coupling capacitor and an output connected to the output capacitor; and
wherein the at least one embedded integrated circuit die comprises:
an input rectifier coupled to the input coupling capacitor, and an output rectifier coupled to the transformer; and
multiple switching transistors coupled between the input rectifier and the transformer.

20. The system of claim 17, wherein the substrate is a printed circuit board.

* * * * *